United States Patent [19]
Aga et al.

[11] Patent Number: 5,998,281
[45] Date of Patent: *Dec. 7, 1999

[54] SOI WAFER AND METHOD FOR THE PREPARATION THEREOF

[75] Inventors: Hiroji Aga; Kiyoshi Mitani; Masatake Katayama, all of Gunma-ken, Japan

[73] Assignee: Shin-Etsu Handotai Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/698,457

[22] Filed: Aug. 15, 1996

[30] Foreign Application Priority Data

Aug. 17, 1995 [JP] Japan .................................. 7-209451

[51] Int. Cl.$^6$ .................................................. H01L 21/762
[52] U.S. Cl. ...................... 438/459; 438/455; 438/977; 156/153; 148/DIG. 12
[58] Field of Search ................ 156/629.1, 630, 156/645.1, 153, 310; 437/225, 974, 977; 438/692, 455, 459, FOR 104, FOR 105, FOR 119; 216/89, 99; 148/DIG. 12

[56] References Cited

U.S. PATENT DOCUMENTS

| | | |
|---|---|---|
| 5,024,723 | 6/1991 | Goesele et al. . |
| 5,213,986 | 5/1993 | Pinker et al. . |
| 5,218,226 | 6/1993 | Slatter et al. ............................ 257/546 |
| 5,286,670 | 2/1994 | Kang et al. ................................ 437/61 |
| 5,514,235 | 5/1996 | Mitani et al. . |
| 5,705,421 | 1/1998 | Matsushita et al. ....................... 437/62 |

FOREIGN PATENT DOCUMENTS

| | | |
|---|---|---|
| 0 676 796 | 10/1995 | European Pat. Off. . |
| 0 706 203 | 4/1996 | European Pat. Off. . |

OTHER PUBLICATIONS

K. Imai, *Japanese Journal of Applied Physics*, 30(6), 1154–1157 (1991).

*Primary Examiner*—Marion McCamish
*Assistant Examiner*—Cheryl Juska
*Attorney, Agent, or Firm*—Wenderoth, Lind & Ponack, L.L.P.

[57] ABSTRACT

Proposed is an improvement in the process for the preparation of an SOI wafer comprising the steps of: forming an oxidized surface film on the mirror-polished surface of a first mirror-polished semiconductor silicon wafer as the base wafer; forming a doped layer with a dopant in a high concentration on the mirror-polished surface of a second mirror-polished semiconductor silicon wafer as the bond wafer; bringing the base wafer and the bond wafer into contact each with the other at the oxidized surface film and the doped layer; and subjecting the thus contacted semiconductor silicon wafers to a heat treatment to effect integral bonding thereof into a precursor of an SOI wafer. The improvement of the invention is accomplished by polishing the surface of the doped layer on the bond wafer before the base wafer and the bond wafer are joined by contacting at the oxidized surface film and the doped layer so that a great improvement can be obtained in the bonding strength between layers.

4 Claims, 5 Drawing Sheets

SOI WAFER AND METHOD FOR THE PREPARATION THEREOF

BACKGROUND OF THE INVENTION

The present invention relates to a method for the integral bonding of two semiconductor silicon wafers or, more particularly, to a so-called SOI (silicon-on-insulator) wafer and a method for the preparation thereof.

It is known that, when two mirror-polished semiconductor silicon wafers or a two silicon wafers of which at least one is provided with an oxidized surface film of silicon formed on the surface are brought into contact at the mirror-polished surfaces under clean conditions, the wafers adhere one to the other even without using any adhesive or other bonding means. This phenomenon is referred to as joining hereinafter. This condition of joining, however, is not a state of complete bonding so that the wafers can be firmly bonded together only after a heat treatment of the wafers under junction. This state of firm bonding is referred to as "integral bonding" hereinafter. An SOI wafer as the subject matter of the present invention is obtained by integrally bonding two semi-conductor silicon wafers, of which at least one has an oxidized surface, with the oxidized surface film or films interposed between the wafers.

Such an SOI wafer can be freely subjected to subsequent treatments such as a high-temperature heat treatment and various types of chemical treatments because no foreign substances such as an adhesive and the like need not be interposed between the component wafers and has an advantage that formation of a pn-junction and embedding of a dielectric material can be accomplished efficiently and conveniently. Accordingly, SOI wafers are highlighted in recent years as a practically applicable item along with the rapid progress in the technology of thin film formation relative to the flatness and cleanness of the surface.

The progress in the technology of semiconductor devices in recent years to accomplish higher and higher degrees of integration and higher and higher operating velocities has led to a trend in the SOI wafers of which the thickness of the active layer is decreasing. For example, an SOI wafer of which the thickness of the active layer for the formation of a semiconductor device is as small as around 0.1 μm is now required. An SOI wafer having such an extremely thin active layer can never be prepared by a conventional mechanical working method such as grinding and polishing. Suitable thickness-reducing methods for finishing include, for example, the etch-stop method by using a high-concentration layer of dopant reported by K. Imai in Japanese Journal of Applied Physics, volume 30 (1991), page 1154, the dry etching method disclosed in Japanese Patent Kokai 5-33539 and so on.

The above mentioned etch-stop method with a high-concentration layer of dopant is described by making reference to FIGS. 3A to 3F of the accompanying drawing, each of which illustrates one of the steps (A) to (F), respectively, in the method by a schematic cross sectional view of the wafers. In step (A), as is illustrated in FIG. 3A, an ordinary semiconductor silicon wafer 1 having a thickness of 600 to 1000 μm as a substrate, which is referred to as the base wafer hereinafter, is provided with an oxidized surface film 1A having a thickness of 1 μm or smaller on the mirror-polished flat surface. On the other hand, a second silicon wafer 2 having a thickness of 600 to 800 μm, which is referred to as a bond wafer hereinafter, is subjected to a doping treatment with a boron dopant on the mirror-polished surface by the thermal diffusion method or ion implantation method to form a high-concentration doped layer 2A to serve as the active layer for the formation of a semiconductor device, of which the thickness is about 0.5 μm and the concentration of the dopant is around $10^{20}$ atoms per $cm^3$.

In step (B), in the next place, the two wafers 1 and 2 after the above described pretreatment are brought into contact each with the other at the respective mirror-polished surfaces, as is illustrated in FIG. 3B, in a clean atmosphere at room temperature to be joined together with the oxidized film 1A and the dopant-diffused layer 2A in direct contact followed by a heat treatment at a temperature in the range from 700 to 1000° C. in an atmosphere of oxygen for about 1 hour to effect integral bonding of the wafers 1 and 2. In this heat treatment, diffusion of the dopant proceeds through the bond wafer 2 so that the thickness of the doped layer in a high dopant concentration is increased while the concentration thereof is somewhat decreased.

In step (C) of the process, the integrally bonded body of the wafers 1 and 2, i.e. a precursor of an SOI wafer, is subjected to mechanical grinding or polishing to thin down the bond wafer 2 until the thickness thereof is decreased into a thin layer having a thickness of 5 to 10 μm, as is illustrated in FIG. 3C.

In step (D), in the next place, the integrally bonded body of wafers 1 and 2 after the mechanical grinding or polishing treatment on the bond wafer 2 in step (C) is subjected to an etching treatment with an aqueous etching mixture prepared by blending 3400 ml of ethylenediamine, 600 g of pyrocatechol and 1600 ml of water at a temperature of 100 to 110° C. so that etching of the bond wafer layer rapidly proceeds and to remove the portion with a low dopant concentration so that the dopant concentration at the etching front is succeedingly increased to gradually decrease the rate of etching until etching is stopped at a certain level of the dopant concentration. By this etch-stop method, the bond wafer 2 is removed by etching leaving only a thin layer 2A of a relatively high dopant concentration having a thickness of about 0.5 μm. as is illustrated in FIG. 3D.

In step (E), in the next place, the surface of the bond wafer 2 or the dopant-diffused layer 2A is subjected to a thermal oxidation treatment to form an oxidized film 2B on the surface. The dopant is taken into this oxidized surface film 2B under growing so that the concentration thereof in the dopant-diffused layer 2A is decreased to one tenth to one twentieth provided that the conditions for the growth are adequately controlled. Thus, a thin layer of silicon 2A having a thickness of 0.1 to 0.2 μm, referred to as an SOI layer hereinafter, is formed between the above mentioned oxidized surface film 1A for integral bonding and the oxidized film 2B grown on the surface, as is illustrated in FIG. 3E.

Finally, in step (F), this oxidized surface layer 2B is removed by etching with diluted hydrofluoric acid so as to give an SOI wafer having an extremely thin SOI layer 2A exposed on the surface, as is illustrated in FIG. 3F.

In connection with the method for the preparation of such an SOI wafer having an extremely thin SOI layer 2A, however, a trouble is sometimes encountered during the procedure of the mechanical grinding or polishing for obtaining a very thin SOI layer 2A as mentioned above or during the procedure for the preparation of a semiconductor device by using the SOI wafer that exfoliation or separation between layers takes place due to incomplete bonding. When two wafers 1 and 2 are joined together to prepare an integrally bonded wafer through the heat treatment, for example, separation of the two wafers takes place in the course of grinding and polishing to decrease the thickness of the bond wafer 2 to 5 to 10 μm as in usual cases.

In the case of an integrally bonded wafer obtained by bonding a bond wafer having a high-concentration doped layer on the mirror-polished surface and a base wafer after oxidation of the mirror-polished surface, in particular, troubles are sometimes caused that separation takes place between the bonded surfaces due to weakness of the bonding strength.

The inventors have conducted studies for finding the mechanism of these troubles to arrive at a discovery that, when two mirror-polished wafers without a high-concentration layer of dopant on the surface are to be bonded together, the surface roughness of each of the bonded surfaces as mirror-polished does not exceed, for example, about 10 bits as estimated in terms of the haze level based on the scattering intensity of a laser beam. A satisfactory integrally bonded SOI wafer can be obtained when such mirror-polished wafers with the above haze level are joined together after thermal oxidation of one or both of these wafers followed by a bonding heat treatment.

It has been discovered that the surface of a wafer having a layer doped with boron or antimony in a high concentration, however, is necessarily roughened in the course of thermal diffusion or ion implantation of the dopant so that no satisfactory integrally bonded wafer can never be obtained from such a wafer having a roughened surface due to occurrence of voids in a large number. The bonding strength in an SOI wafer having such voids is low so that separation of the layers frequently takes place in the course of the polishing process for thickness reduction of the SOI layer or in the course of the preparation of a semiconductor device after thickness reduction of the SOI layer.

SUMMARY OF THE INVENTION

The present invention accordingly has an object to provide, in view of the above described situations relative to an SOI wafer, an SOI wafer having a high bonding strength between layers not to cause separation between layers in the process for the preparation of an SOI wafer with an extremely thin SOI layer or in the course of the manufacture of a semiconductor device from such an SOI wafer.

Thus, the present invention provides an improvement, in the process for the preparation of an SOI wafer comprising the steps of:

forming an oxidized film on the mirror-polished surface of a first mirror-polished semiconductor silicon wafer to serve as a base wafer; forming a doped layer with a dopant in a high concentration on the mirror-polished surface of a second mirror-polished semiconductor silicon wafer to serve as a bond wafer; bringing the first and the second semiconductor silicon wafers into contact each with the other at the oxidized surface film and the doped layer; and subjecting the thus contacted semiconductor silicon wafers to a heat treatment to effect integral bonding thereof into a precursor of an SOI wafer, which improvement comprises bringing the first and the second semiconductor silicon wafers into contact each with the other at the oxidized surface film and the doped layer after polishing of the surface of the doped layer on the second semiconductor silicon wafer.

DETAILED DESCRIPTION OF THE PREFERRED EMBODIMENT

The procedure for the preparation of an SOI wafer having an extremely thin SOI layer by the utilization of the etch-stop method with a high-concentration layer of dopant is already described by making reference to FIGS. 3A to 3F for the steps (A) to (F), respectively. The process according to the present invention is characterized in that, in conducting the steps (A) and (B) in the same manner as in the prior art, in which a first semiconductor silicon wafer 1, i.e. base wafer as the substrate, which is provided with an oxidized surface film 1A on the mirror-polished surface, is brought into contact with a second semiconductor silicon wafer 2, i.e. bond wafer, which is provided on the mirror-polished surface with a doped layer 2A with a dopant in a high concentration by the method of thermal diffusion or ion implantation, at the respective mirror-polished surfaces to be joined together, the surface of the doped layer 2A of the bond wafer is subjected to a mechano-chemical polishing treatment before the base wafer 1 and the bond wafer 2 are brought into contact each with the other. When the heat treatment is undertaken for the joined wafers 1 and 2 after the above mentioned polishing of the surface of the diffused layer on the bond wafer 2, a precursor of an SOI wafer having a very high bonding strength between layers can be obtained.

The precursor of an SOI wafer obtained in the above described manner is further worked in the sequential order of the steps (C) to (F) in substantially the same manner as in the prior art. Namely, the bond wafer 2 of this integrally bonded precursor wafer is ground and polished until the thickness thereof is reduced to about 5 to 10 μm and then this ground and polished surface is subjected to the etch-stop treatment with a high-concentration layer of dopant to expose the above mentioned diffusion layer 2A. The dopant concentration in the diffusion layer 2A is decreased by undertaking a further thermal oxidation treatment and the thickness of the SOI layer 2A is defined followed by removal, by using hydrofluoric acid, of the oxidized film 2B formed on the silicon layer having a thus reduced thickness to give an SOI wafer with a thin film of silicon having a thickness of about 0.2 μm or smaller as a final product according to the inventive method.

Figure 4:
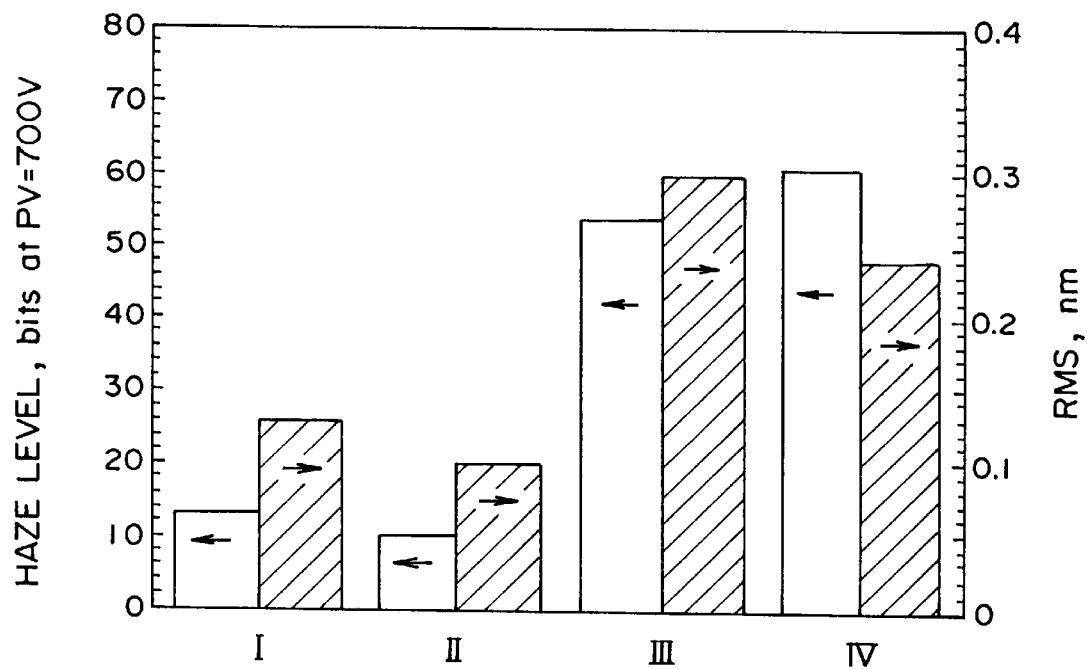
FIG. 4 gives histograms showing the values of th e surface roughness expressed by the haze level values and RMS ("root-means square" roughness ) values.

The histograms of FIG. 4 of the accompanying drawing show the roughness of the surface of the bond wafer 2 after the above mentioned diffusion treatment with a high-concentration layer of dopant for making comparison between the RMS values in the unit of nm (shaded columns of the histogram, right ordinate) as measured with an AFM (atomic force microscope) and the haze level values in the unit of bits (open columns of the histogram, left ordinate) as measured by means of the scattering intensity of a laser beam using an instrument therefor (Model LS-6000, manufactured by Hitachi Electronics Engineering Co.) for four different types of bond wafers includ-ing p-type mirror-polished wafer (histograms I), n-type mirror-polished wafer (histograms II), p-type mirror-polished wafer with a boron-diffused layer on the surface (histograms III) and n-type mirror-polished wafer with a boron-diffused layer on the surface (histograms IV). As is understood from the histograms, a good parallelism is found between the RMS values and the haze level values. For example, a p-type mirror-polished silicon wafer with a boron-diffused layer on the surface has a RMS value of 0.3 nm and a haze level value of about 54 bits at a detection voltage of 700 volts (PV=700 volts). In the following description, accordingly, the surface roughness is expressed in terms of the haze level values in bits because the measuring method for the haze level values is simple and convenient as compared with the method using an AFM.

The method for polishing of the surface of the bond wafers after the above mentioned diffusion treatment is not particularly limitative and can be performed according to a known procedure. For example, a typical polishing method is the so-called mechano-chemical polishing method. While it is usual in the polishing works to obtain a mirror-polished surface of a silicon wafer that the polishing work is undertaken in three steps of primary, secondary and finish steps to remove the surface layer of the wafer having a thickness of about 20 $\mu$m, the polishing work undertaken to accomplish the invention is conducted under the mirror-polishing conditions corresponding to the finish polishing in the conventional polishing works to remove the surface layer having a thickness not exceeding 1 $\mu$m or, usually, in the range of 0.1 to 0.2 $\mu$m. Alternatively, the mirror-polishing treatment can be replaced with precision grinding to obtain substantially identical results.

Figure 5:
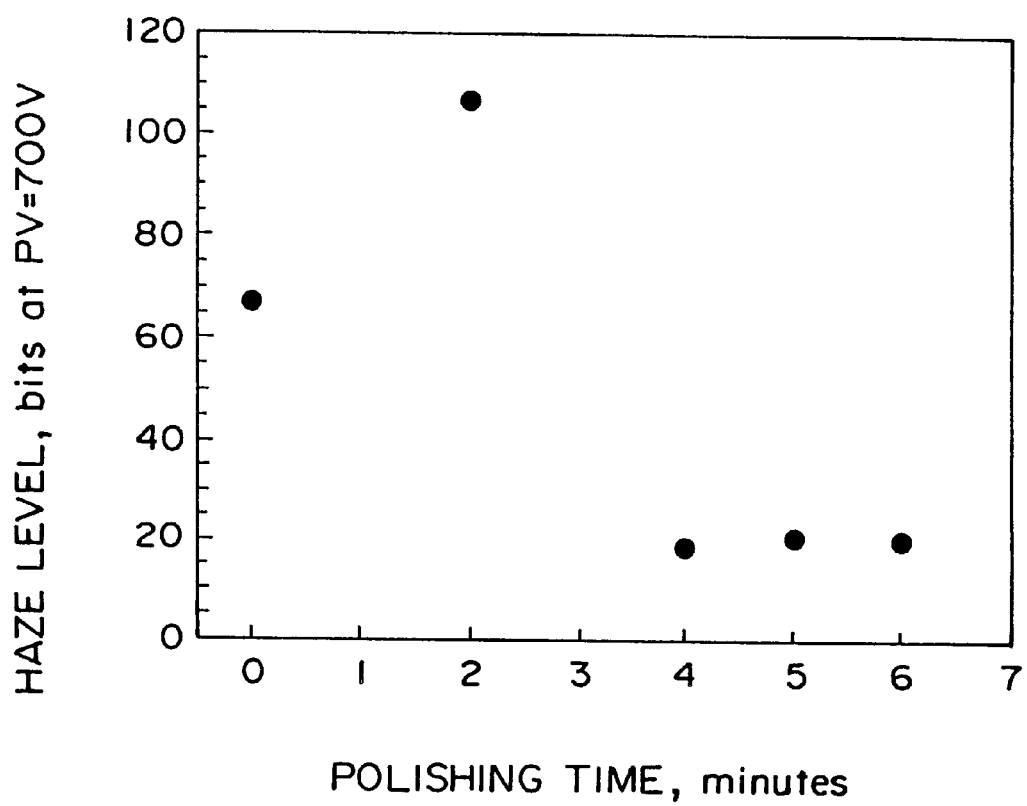
FIG. 5 is a graph showing the changes in the haze level value of the polished surface as a function of the polishing time.

FIG. 5 of the accompanying drawing is a graph showing the haze level values of the wafer surface after the above mentioned mirror-polishing method as a function of the polishing time in minutes, according to which it is understood that a sufficiently low haze level of 20 bits or lower can be obtained by the polishing work of 4 minutes or longer under the polishing conditions here undertaken including the polishing rate of 0.02 $\mu$m/minute.

Although it is desirable that the surface roughness of the wafer after the mirror-polishing treatment should be 20 bits or lower in the haze level as in conventional mirror-polished silicon wafers, which corresponds to a RMS value of 0.15 nm or smaller by the AFM measurement as is suggested by the histograms in FIG. 4, this is not an essential requirement. Further, the amount of thickness reduction in the surface layer by the mirror-polishing work should not be too large in order not to cause an influence on the sheet resistance when the thickness of the diffusion layer is too small.

According to the present invention, an SOI wafer having a high bonding strength between layers can be obtained by polishing the surface of a wafer, which may be roughened in the course of the formation of a doped layer in a high concentration of the dopant, in such a way that the sheet resistance of the diffusion layer is never affected thereby even when the surface is roughened.

While, in the present invention, the oxidized film is formed on the base wafer alone, it is optional that the bond wafer is provided with an oxidized film instead or both of the base wafer and bond wafer are each provided with an oxidized layer insofar as no influence is caused on the dopant-diffused layer of the bond wafer in the course of the formation of the oxidized film. In this regard, it has been established that the method of the present invention is applicable if the temperature does not exceed 900° C. in the formation of an oxidized film on a boron dopant-diffused bond wafer.

In the following, an embodiment of the present invention is described in more detail by way of an example and comparative examples.

EXAMPLE AND COMPARATIVE EXAMPLES 1 to 3

A silicon wafer to serve as the bond wafer, which was an ntype semiconductor silicon wafer after mirror-polishing having a diameter of 125 mm and a thickness of 0.625 mm, was subjected to the measurement of the haze level value as a measure of the surface roughness by using the instrument (LS-6000, supra) at a detection voltage of 700 volts to find that the haze level was 10 bits. This wafer was used as such in Comparative Example 1.

The silicon wafer described above was coated on the mirror-polished surface with a boron-doping solution (PBF, Poly Boron Film, 6M-10, a product by Tokyo Ohka Kogyo Co.) and subjected to a heat treatment at 1050° C. for 40 minutes in an atmosphere of nitrogen to effect diffusion of boron into the silicon wafer followed by cleaning of the wafer with a cleaning solution, referred to as the SC-1 hereinafter, which was a mixture of $NH_4OH$, $H_2O_2$ and $H_2O$ in a weight ratio of 1:1:80.

Thereafter, this wafer was freed from the BSG (boron silicate glass) by dipping in a 5% aqueous solution of hydrogen fluoride for 1 minute and then subjected to pyro-oxidation at 800° C. for 5 minutes to remove the boron silicide. Further, the wafer was dipped in a 5% aqueous solution of hydrogen fluoride for 1 minute to remove the oxidized film followed by cleaning of the wafer with the SC-1 mentioned above to give a boron-diffused wafer.

Figure 2A:
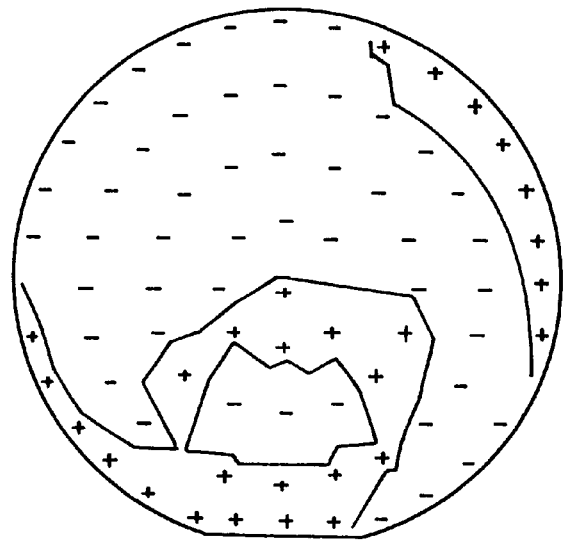
FIGS. 2A and 2B each show the distribution of the sheet resistance within the diffusion surface before and after polishing, respectively, of the mirror-polished surface in the Example.

The haze level value as a measure of the roughness of the diffusion surface to serve as the bonding surface was measured by the instrument (LS-6000, supra) to find a very large value of 67 bits. Further, the diffusion surface of this wafer to serve as a bond wafer was subjected to the measurement of the distribution of the sheet resistance. The average sheet resistance $\rho s$ was 12.35 ohm with a standard deviation $\rho$ of 0.46% and the distribution of the sheet resistance was as shown in FIG. 2A, in which the signs of (+) are for the values higher than the average and the signs of (−). are for the values lower than the average. This bond wafer was used in Comparative Example 2.

Figure 2B:
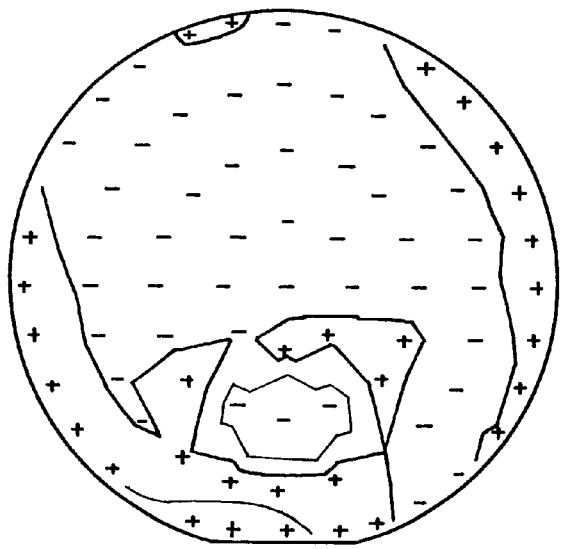
Figure 3A:
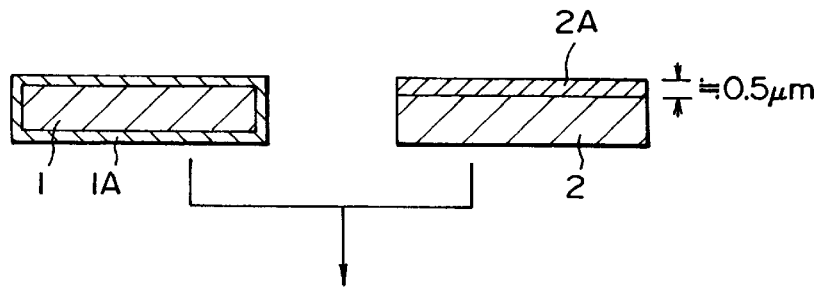
FIGS. 3A to 3F are each a schematic illustration of one of the steps in the preparation process of an SOI wafer in the prior art by the application of the etch-stop method with a high-concentration layer of dopant.
Figure 3B:
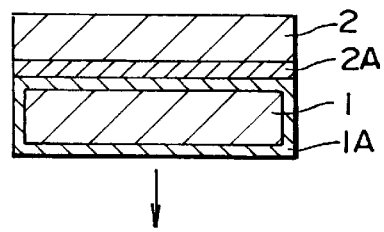
Figure 3C:
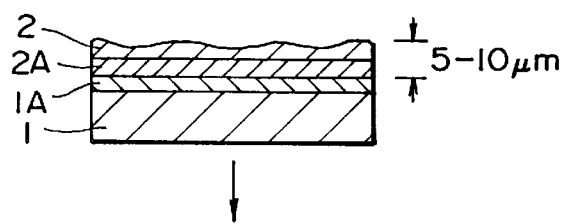
Figure 3D:
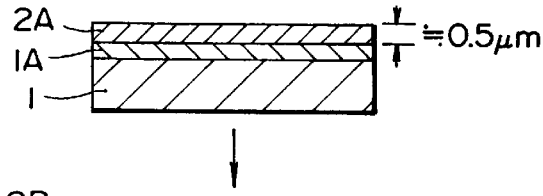
Figure 3E:
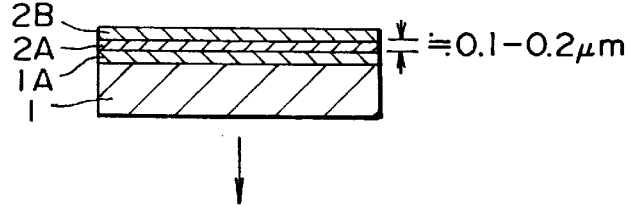
Figure 3F:
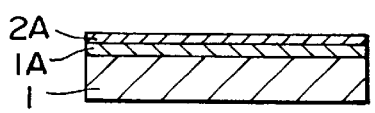

The diffusion surface of this bond wafer was then subjected to mirror-polishing for 5 minutes under a load of 150 g/cm² at a polishing rate of 0.02 $\mu$m/minute to remove a surface layer of 0.1 $\mu$m thickness and then the haze level thereof was measured to find a value of 20 bits. The average sheet resistance of this surface $\rho S$ was 12.49 ohm with a standard deviation $\rho$ of 0.52% and the distribution of the sheet resistance was as shown in FIG. 2B so that it was concluded that the sheet resistance was little affected by the mirror-polishing treatment. This bond wafer was used in the inventive Example.

Another boron-diffused semiconductor silicon wafer was prepared in substantially the same manner as in the preparation of the bond wafer of Comparative Example 2 except that the diffusion treatment of boron and oxidation for the removal of boron silicide were conducted by a single heat treatment and the haze level of the boron-diffused surface was measured to obtain a value of 40 bits. This bond wafer was used in Comparative Example 3.

Separately, base wafers were prepared by subjecting a p-type semiconductor silicon wafer having a diameter of 125 mm and a thickness of 0.625 mm to a pyro-oxidation treatment at 1100° C. for 30 minutes to form a thermal oxidation film of 0.5 μm thickness. These base wafers were subjected to the bonding test by a heat treatment with one of the bond wafers for the inventive Example and Comparative Examples 1 to 3 described above in the following manner. Thus, the base wafer and one of the bond wafers were joined together by laying one on the other with the respective mirror-polished surfaces in direct contact each with the other at room temperature. The wafers as joined were subjected to an integral bonding treatment by heating at 700° C., 800° C. or 900° C. for 60 minutes in an atmosphere of oxygen.

Figure 1:
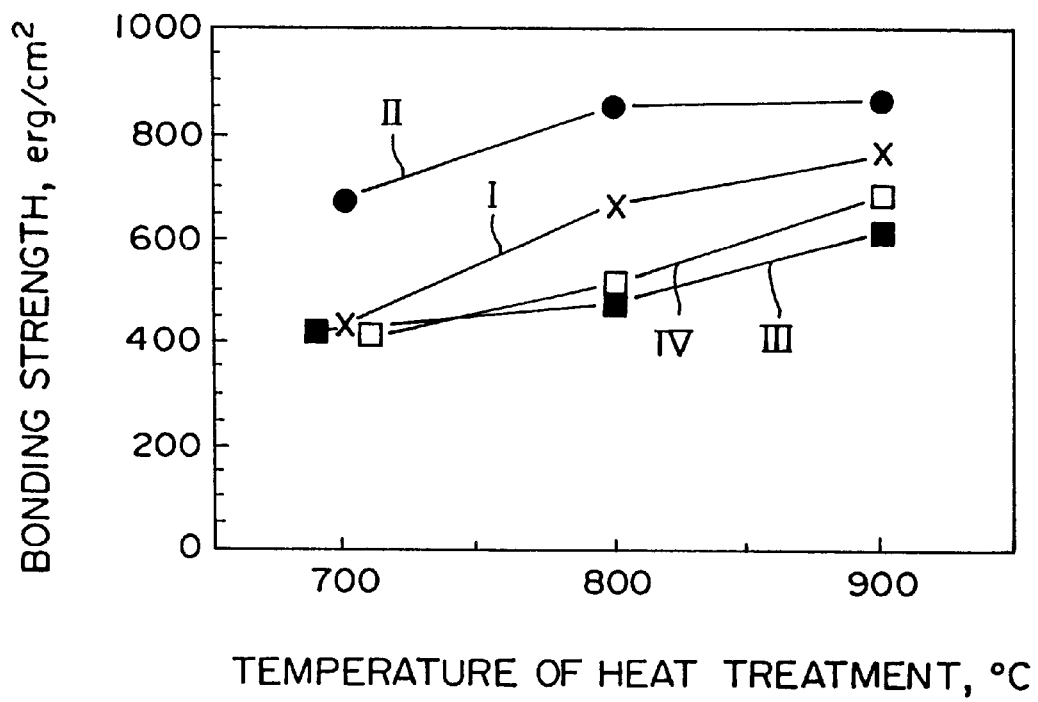
FIG. 1 is a diagram showing the bonding strength in wafers integrally bonded by a heat treatment at varied temperatures.

The bonding strength between layers in the thus integrally bonded wafers was estimated by the blade method proposed by W. P. Maszara in Journal of Applied Physics, volume 64 (1988), page 4943, according to which a thin sharp blade was thrusted between the base wafer and bond wafer to determine the distance between the edge of the blade and the front of separation of the wafers. The results are shown in FIG. 1 for the respective heating temperatures by plotting with the plots of I, II, III and IV for the inventive Example, Comparative Example 1, Comparative Example 2 and Comparative Example 3, respectively.

What is claimed is:

1. In a process for the preparation of an SOI wafer comprising the steps of: (a) forming an oxidized surface layer on a mirror-polished surface of a first mirror-polished semiconductor silicon wafer; (b) forming a doped layer with a dopant in a high concentration on a mirror-polished surface of a second mirror-polished semiconductor silicon wafer; (c) bringing the first and the second semiconductor silicon wafers into contact with each other at the oxidized surface layer and the doped layer; and (d) subjecting the thus contacted semiconductor silicon wafers to a heat treatment to effect integral bonding thereof into a precursor of an SOI wafer, the improvement which comprises polishing the surface of the doped layer on the second semiconductor silicon wafer before bringing the first and the second semiconductor silicon wafers into contact with each other at the oxidized surface film and the doped layer in step (c), and wherein the surface of the doped layer after polishing has a haze level not exceeding 20 bits.

2. The improvement as claimed in claim 1 in which the reduction in thickness of the doped layer by polishing does not exceed 1 μm.

3. In a process for the preparation of an SOI wafer comprising the steps of: (a) forming an oxidized surface layer on the mirror-polished surface of a first mirror-polished semiconductor silicon wafer; (b) forming a doped layer with a dopant in a high concentration on the mirror-polished surface of a second mirror-polished semiconductor silicon wafer; (c) bringing the first and the second semiconductor silicon wafers into contact with each other at the oxidized surface layer and the doped layer; (d) subjecting the thus contacted semiconductor silicon wafers to a heat treatment to effect integral bonding thereof into a precursor of an SOI wafer; and (e) thinning down the second semiconductor silicon wafer of the precursor of an SOI wafer obtained in step (d), the improvement which comprises polishing the surface of the doped layer on the second semiconductor silicon wafer before bringing the first and the second semiconductor silicon wafers into contact with each other at the oxidized surface film and the doped layer in step (c) and thinning down the second semiconductor silicon wafer in step (e) by the etch-step method using an high-concentration layer of the dopant. and wherein the surface of the doped layer after polishing has a haze level not exceeding 20 bits.

4. The improvement as claimed in claim 3 in which the reduction in thickness of the doped layer by polishing does not exceed 1 μm.

* * * * *